| (12) | United States Patent | (10) Patent No.: | US 12,094,720 B2 |
|---|---|---|---|
| | Chou | (45) Date of Patent: | Sep. 17, 2024 |

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Chung-Yen Chou, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 418 days.

(21) Appl. No.: 17/468,804

(22) Filed: Sep. 8, 2021

(65) Prior Publication Data

US 2022/0044940 A1 Feb. 10, 2022

Related U.S. Application Data

(63) Continuation of application No. PCT/CN2021/103426, filed on Jun. 30, 2021.

(30) Foreign Application Priority Data

Aug. 5, 2020 (CN) .......................... 202010776427.6

(51) Int. Cl.
*H01L 21/31* (2006.01)
*H01L 21/027* (2006.01)
(Continued)

(52) U.S. Cl.
CPC .... *H01L 21/31144* (2013.01); *H01L 21/0274* (2013.01); *H01L 21/0332* (2013.01); *H01L 21/0337* (2013.01); *H10B 12/485* (2023.02)

(58) Field of Classification Search
CPC ........... H01L 21/31144; H01L 21/0274; H01L 21/0332; H01L 21/0337; H10B 12/485;
(Continued)

(56) References Cited

U.S. PATENT DOCUMENTS

| 8,012,817 B2 | 9/2011 | Masuoka |
| 8,357,581 B2 | 1/2013 | Masuoka |

(Continued)

FOREIGN PATENT DOCUMENTS

| CN | 100452354 C | 1/2009 |
| CN | 101685780 A | 3/2010 |

(Continued)

OTHER PUBLICATIONS

International Search Report in the international application No. PCT/CN2021/103426, mailed on Sep. 28, 2021, 2 pgs.

*Primary Examiner* — Mohammad M Hoque
(74) *Attorney, Agent, or Firm* — Kilpatrick Townsend & Stockton LLP

(57) ABSTRACT

A semiconductor structure and a manufacturing method thereof are provided. The manufacturing method includes: forming a stacked structure on the substrate, the stacked structure at least including a first material layer, a second material layer and a third material layer from bottom to top; patterning the stacked structure to obtain a first pattern structure; forming a spacer structure on a side wall of the first pattern structure, a top of the spacer structure being not lower than a top of the first material layer; and removing the third material layer, wherein during removing the third material layer, an etching selectivity of the third material layer to the second material layer is greater than 1.

14 Claims, 5 Drawing Sheets

(51) Int. Cl.
*H01L 21/033* (2006.01)
*H01L 21/311* (2006.01)
*H10B 12/00* (2023.01)

(58) Field of Classification Search
CPC ... H10B 12/482; H10B 12/0335; H10B 12/09
USPC ........................................................ 257/296
See application file for complete search history.

(56) References Cited

U.S. PATENT DOCUMENTS

| | | | |
|---|---|---|---|
| 8,691,680 B2 | 4/2014 | Wang | |
| 8,754,487 B2 | 6/2014 | Masuoka et al. | |
| 2007/0042556 A1 | 2/2007 | Lin | |
| 2010/0078733 A1* | 4/2010 | Masuoka | H01L 29/4966 |
| | | | 438/303 |
| 2011/0303991 A1 | 12/2011 | Masuoka | |
| 2013/0015551 A1* | 1/2013 | Wang | H10B 12/48 |
| | | | 257/E27.07 |
| 2013/0119485 A1 | 5/2013 | Masuoka et al. | |
| 2017/0069726 A1* | 3/2017 | Kye | H01L 21/7682 |
| 2018/0301459 A1* | 10/2018 | Kim | H10B 12/482 |
| 2020/0135888 A1* | 4/2020 | Zhu | H01L 29/66568 |

FOREIGN PATENT DOCUMENTS

| | | | |
|---|---|---|---|
| CN | 102881658 A | | 1/2013 |
| CN | 104681494 A | * | 6/2015 |
| CN | 107195550 A | | 9/2017 |

* cited by examiner (a) (b)

(a) (b)

111# SEMICONDUCTOR STRUCTURE AND MANUFACTURING METHOD THEREOF

CROSS-REFERENCE TO RELATED APPLICATIONS

This is a continuation application of International Patent Application No. PCT/CN2021/103426, filed on Jun. 30, 2021, which claims priority to Chinese Patent Application No. 202010776427.6, filed before the State Intellectual Property Office of China on Aug. 5, 2020, entitled "Semiconductor Structure and Manufacturing Method thereof". The contents of International Patent Application No. PCT/CN2021/103426 and Chinese Patent Application No. 202010776427.6 are incorporated herein by reference in their entireties.

TECHNICAL FIELD

The disclosure relates to the technical field of semiconductor memory devices, and more particularly relates to a semiconductor structure and a method for manufacturing thereof.

BACKGROUND

As a critical size of a semiconductor memory continues to decrease, the integration level of device structures is getting higher and higher. Especially, in the process for manufacturing a Dynamic Random Access Memory (DRAM) with a critical size of less than 20 nm, in order to improve the device quality, a mask pattern (at least including an organic mask material layer and a hard mask material layer formed in sequence) is required to have a good shape. At present, spacer structures are usually arranged on the side walls of the mask pattern to prevent the mask pattern from being damaged. However, during some processes in which a deposited material layer is etched back to form a spacer structure, due to a thinner hard mask material layer, the height of the formed spacer structure is less than the height of the organic mask material layer, which will inevitably expose the organic mask material layer in the mask pattern. If a photoresist needs to be coated on the mask pattern subsequently, the organic mask material layer will be damaged when the photoresist is removed subsequently, which will result in deformation of the mask pattern and deterioration of the device quality.

SUMMARY

According to various embodiments of the disclosure, a semiconductor structure and a method for manufacturing thereof are provided.

The disclosure provides a method for manufacturing a semiconductor structure, including the following operations.

A substrate is provided.

A stacked structure is formed on the substrate, and the stacked structure at least includes a first material layer, a second material layer and a third material layer from bottom to top.

The stacked structure is patterned to obtain a first pattern structure.

A spacer structure is formed on a side wall of the first pattern structure.

The third material layer is removed, and during removing the third material layer, an etching selectivity of the third material layer to the second material layer is greater than 1.

The embodiments of the disclosure further provide a semiconductor structure formed by the method for manufacturing the semiconductor structure described in the above embodiment, including: a substrate; a first material layer located on the substrate; a second material layer located on the first material layer and arranged in a stacked manner with the first material layer; and a spacer structure arranged on a side wall of the first material layer and the second material layer. The top of the spacer structure is not lower than the top of the first material layer.

The disclosure provides a semiconductor structure and a manufacturing method thereof. The manufacturing method includes the following operations. A substrate is provided; a stacked structure is formed on the substrate, and the stacked structure at least includes a first material layer, a second material layer and a third material layer from bottom to top; the stacked structure is patterned to obtain a first pattern structure; a spacer structure is formed on a side wall of the first pattern structure; and the third material layer is removed, and in the process of removing the third material layer, the etching selectivity of the third material layer to the second material layer is greater than 1. In the disclosure, first, the stacked structure including the first material layer, the second material layer and the third material layer is formed, and then, the spacer structures are formed on the side walls of the first pattern structure, so that the height of each spacer structures may be effectively increased to ensure that the height of each spacer structure is greater than the height of the first material layer as much as possible, so as to enhance the protection to the first material layer and prevent the first material layer from being damaged in the subsequent processes, thereby improving the device quality.

BRIEF DESCRIPTION OF THE DRAWINGS

In order to illustrate the technical solutions in the embodiments of the disclosure or in the traditional technology more clearly, the drawings required for description in the embodiments or the traditional technology will be briefly described below. It is apparent that the drawings in the following description are only some embodiments of the disclosure. Those skilled in the art can also obtain other drawings according to these drawings without any creative work.

Figure 1:
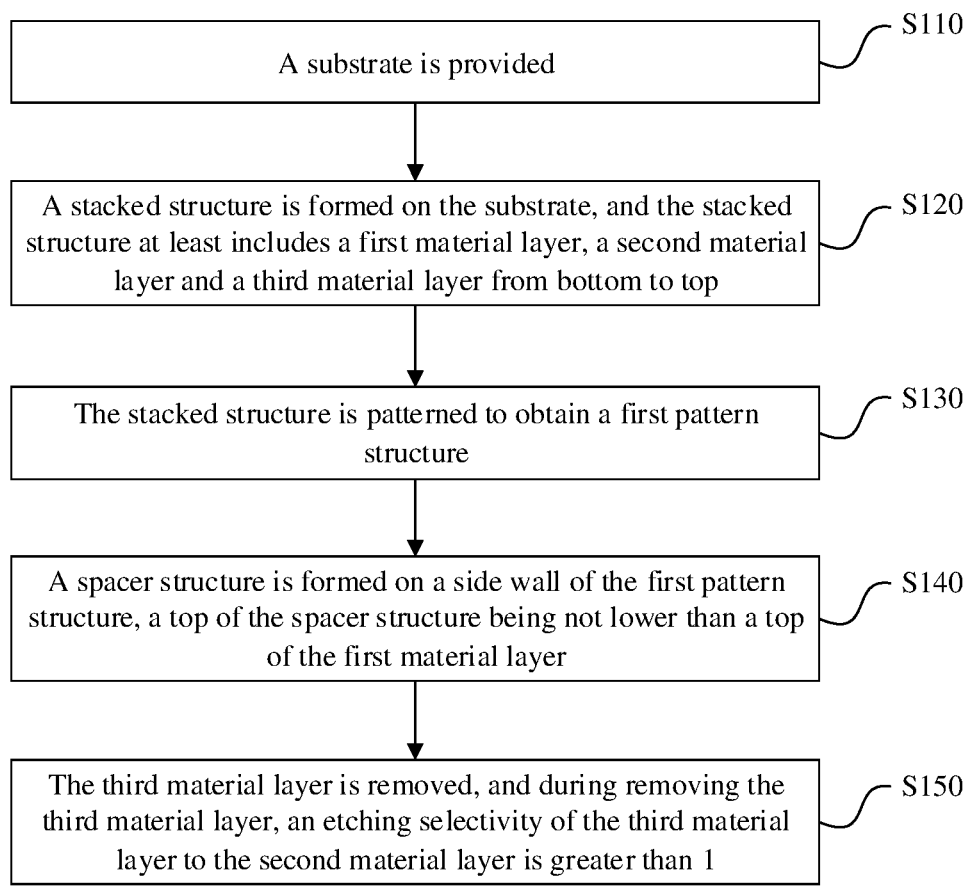
FIG. 1 is a schematic flowchart of a method for manufacturing a semiconductor structure according to an embodiment.

List of Reference Numerals: substrate 100, stacked structure 200, first material layer 210, second material layer 220, third material layer 230, first pattern structure 200a, spacer structure 300, isolation material layer 300', word line structure 400, bit line structure 500, structural layer to be etched 600, second stacked structure 700, third pattern structure 700a, fourth material layer 710, fifth material layer 720.

DETAILED DESCRIPTION

To facilitate understanding of the disclosure, the disclosure will be described more fully below with reference to the related drawings. The embodiments of the disclosure are illustrated in the drawings. The disclosure may, however, be embodied in many different forms which are not limited to the embodiments described herein. On the contrary, these embodiments are provided so that the disclosure will be more thorough and complete.

Unless defined otherwise, all technical and scientific terms used herein have the same meaning as commonly understood by those skilled in the art to which the disclosure belongs. The terms used herein in the specification of the disclosure is for the purpose of describing specific embodiments only and is not intended to limit the disclosure.

It should be understood that when an element or a layer is referred to as being "on", "adjacent to", "connected to" or "coupled to" other elements or layers, the element or layer may be directly on, adjacent to, connected to or coupled to other elements or layers, or there may be intermediate elements or layers. On the contrary, when an element is referred to as being "directly on", "directly adjacent to", "directly connected to" or "directly coupled to" other elements or layers, there are no intermediate elements or layers. It should be understood that although the terms first, second, third, etc. may be used to describe various elements, components, regions, layers, doping types, and/or parts, these elements, components, regions, layers, doping types, and/or parts should not be limited by these terms. These terms are only used to distinguish one element, component, region, layer, doping type, or part from another element, component, region, layer, doping type, or part. Therefore, without departing from the teachings of the disclosure, a first element, component, region, layer, doping type or part discussed below may be represented as a second element, component, region, layer or part.

Spatial relationship terms such as "beneath", "below", "lower", "under", "above", or "upper" may be used herein to describe a relationship between one element or feature and another element or feature shown in the figures. It should be understood that in addition to the orientations shown in the figures, the spatial relationship terms further include different orientations of devices in use and operation.

As used herein, the singular forms "a", "an", "one", and "the" may include the plural forms as well, unless the context clearly indicates otherwise. It should also be understood that the terms "comprising/including" or "having", etc. specify the presence of described features, integers, steps, operations, components, parts, or combinations thereof, but do not preclude the possibility of the presence or addition of one or more other features, integers, steps, operations, components, parts, or combinations thereof. Also, in this specification, the term "and/or" includes any and all combinations of the associated listed items.

Referring to FIG. 1, the disclosure provides a method for manufacturing a semiconductor structure, including the following operations.

In S110, a substrate 100 is provided.

In S120, a stacked structure 200 is formed on the substrate 100, and the stacked structure 200 at least includes a first material layer 210, a second material layer 220 and a third material layer 230 from bottom to top.

In S130, the stacked structure 200 is patterned to obtain a first pattern structure 200a.

In S140, a spacer structure 300 is formed on a side wall of the first pattern structure 200a.

In S150, the third material layer 230 is removed, and during removing the third material layer 230, the etching selectivity of the third material layer 230 to the second material layer 220 is greater than 1.

It is to be understood that in some semiconductor structures, the stacked structure 200 needs to be protected to prevent the stacked structure 200 from being damaged in the subsequent processes, resulting in deterioration of the device quality. In this embodiment, the stacked structure 200 including the first material layer 210, the second material layer 220 and the third material layer 230 is formed firstly, and then the spacer structures 300 are formed on the side walls of the first pattern structure 200a, so that the height of each spacer structure 300 may be effectively increased to ensure that the height of each spacer structure is greater than the height of the first material layer 210 as much as possible, so as to enhance the protection to the first material layer 210 and prevent the first material layer 210 from being damaged in the subsequent processes, thereby improving the device quality. In addition, when the top of each spacer structure 300 is not lower than the top of the first material layer 210, it can be ensured that the first material layer 210 is not exposed. Even if photoetching or other processes are required subsequently, the first material layer 210 cannot be damaged.

In this embodiment, the substrate 100 includes a silicon substrate, an epitaxial silicon substrate, a silicon germanium substrate, a silicon carbide substrate, or a silicon-coated insulating substrate, but is not limited to this. Those skilled in the art may select the type of the semiconductor substrate 100 according to a semiconductor device formed on the semiconductor substrate 100, so that the type of the semiconductor substrate 100 should not limit the protection scope of the disclosure.

In one of the embodiments, the thickness of the second material layer 220 is less than the thickness of the third material layer 230. It is to be understood that when the second material layer 220 is used as a thinner hard mask material layer, the thickness may be very small. Therefore, if the thickness of the third material layer 230 is less than the thickness of the second material layer 220, the first material layer 210 may still be exposed when the spacer structure 300 is formed subsequently. In this embodiment, by arranging the third material layer with a larger thickness, the height of each spacer structure 300 formed by an etching-back technology may be effectively increased, so as to ensure that the top of each spacer structure 300 is higher than the top of the first material layer 210, thereby achieving a good protective effect on the first material layer 210.

In one of the embodiments, the etching selectivity of the third material layer 230 to the second material layer 220 and the spacer structure 300 is greater than 5.

It is to be understood that after the spacer structures 300 are formed, the third material layer 230 needs to be removed. The etching selectivity of the third material layer 230 to the second material layer 220 and the spacer structure 300 is greater than 5, which may ensure that in the process of removing the third material layer 230, the etching on the second material layer 220 and the spacer structures 300 is reduced as much as possible, and the first material layer 210 is prevented from being exposed as much as possible.

In one of the embodiments, the operation of forming the spacer structures 300 includes the following.

An isolation material layer 300' is at least formed on the side walls and upper surface of the stacked structure 200.

The isolation material layer 300' is etched to remove the isolation material layer 300' on the upper surface of the stacked structure 200 and retain the isolation material layer 300' on the side walls of the stacked structure 200, so as to form the spacer structures 300.

Figure 2:
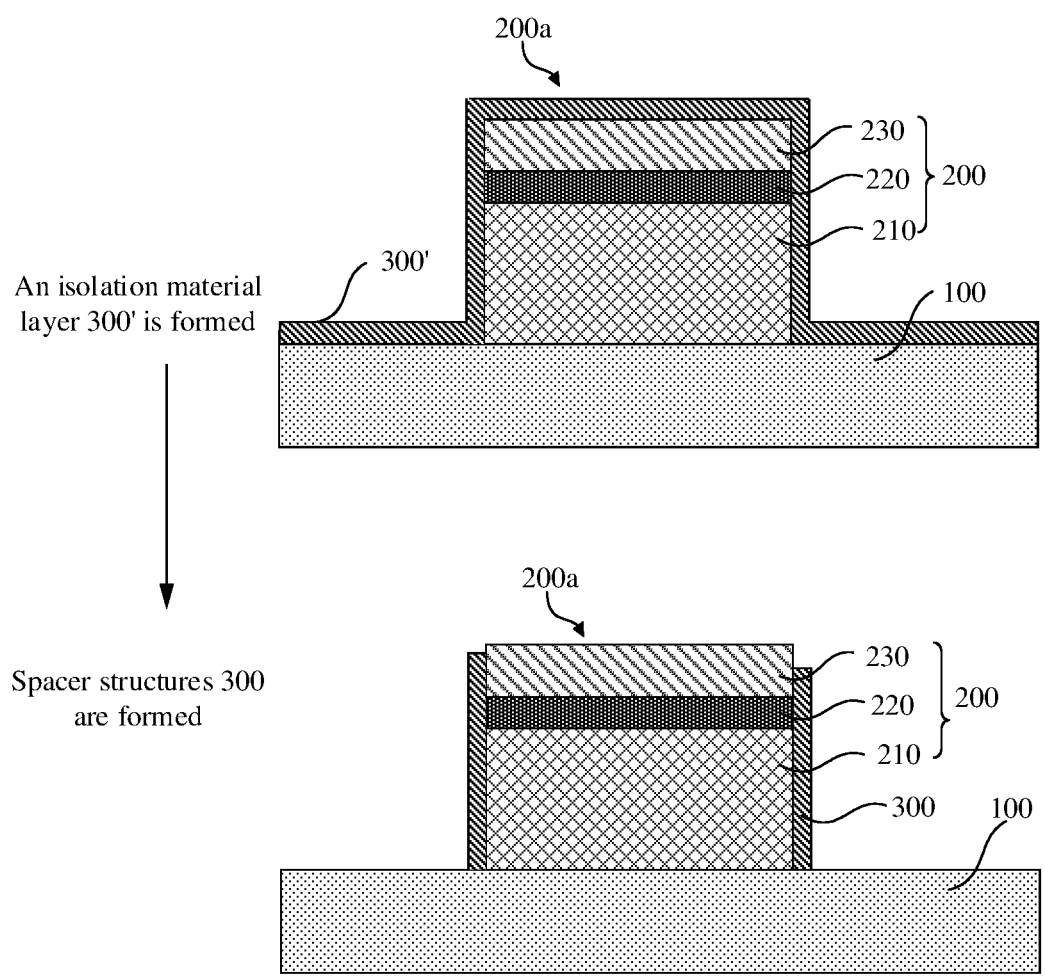
FIG. 2 is a schematic cross-sectional structural diagram of a structure obtained by the operation in S130 of a method for manufacturing a semiconductor structure according to an embodiment.

In this embodiment, referring to FIG. 2, an insulating material is deposited by a deposition process to form the isolation material layer 300', and the isolation material layer 300' at least covers the side walls and upper surface of the stacked structure 200. The deposition process may include Chemical Vapor Deposition (CVD), Low Pressure CVD (LPCVD), Plasma Enhanced CVD (PECVD), Atomic Layer Deposition (ALD), and Plasma Enhanced ALD (PEALD). Then, the isolation material layer 300' is etched by an etching process to remove the isolation material layer 300' on the upper surface of the stacked structure 200 and retain the insulating material on the side walls of the isolation material layer 300', so as to form the spacer structures 300.

In one of the embodiments, the second material layer 220 and the spacer structure 300 are made of a silicon oxide material, and the third material layer 230 is made of a silicon nitride material.

Figure 3:
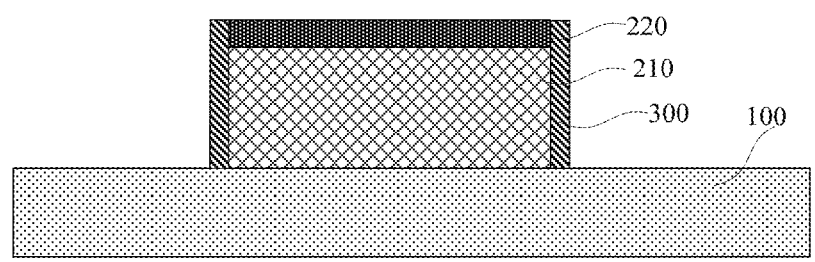
FIG. 3 is a schematic cross-sectional structural diagram of a structure obtained by the operation in S140 of a method for manufacturing a semiconductor structure according to an embodiment.

Referring to FIG. 3, in this embodiment, when the second material layer 220 and the spacer structure 300 are made of a silicon oxide material and the third material layer 230 is made of a silicon nitride material, after the spacer structure 300 is formed, the silicon nitride material is removed by a wet etching process with phosphoric acid. The phosphoric acid has a higher etching selectivity to the silicon nitride material, so that the etching on the spacer material may be reduced to prevent the first material layer 210 from being exposed.

In one of the embodiments, the thickness of the second material layer 220 is 3 nm to 30 nm, and the thickness of the third material layer 230 is 5 nm to 100 nm. It is to be understood that when the second material layer 220 is used as a hard mask material layer, for example, depositing of silicon nitride material to form a hard mask material layer and etching to remove silicon nitride require a longer time, and may increase the production cost. In this embodiment, the thickness of the second material layer 220 is set to be within the range of 3 nm to 30 nm, thereby shortening the process time and reducing the production cost while forming the hard mask material layer.

In one of the embodiments, when the first pattern structure 200a is a first stacked structure, before the first stacked structure is formed, the method further includes an operation of forming a second stacked structure 700 on the substrate.

The second stacked structure 700 is located between the first stacked structure and the substrate 100.

In this embodiment, the substrate 100 includes an array region and a peripheral circuit region located at the periphery of the array region. When the first pattern structure 200a is the first stacked structure, before the stacked structure 200 is formed on the substrate 100, the method further includes the operation of forming the second stacked structure 700 on the substrate 100. The first stacked structure is located above the second stacked structure 700 and is a strip structure extending along a first direction, the second stacked structure 700 is a strip structure extending along a second direction, and the projection of the second stacked structure 700 on the substrate 100 is overlapped with the projection of the first stacked structure on the substrate 100. Specifically, in this embodiment, a node contact hole H is defined by the first stacked structure 200a and the second stacked structure 700.

In one of the embodiments, before the second stacked structure 700 is formed on the substrate 100, the method further includes the following operations.

The substrate is patterned to form an active area.

Word line structures 400 are formed in the substrate 100 or on the substrate 100.

A bit line structure 500 is formed on the substrate 100 where the word line structures 400 are formed.

A structural layer to be etched 600 is formed on the substrate 100 where the bit line structure 500 is formed.

It is to be understood that in this embodiment, after the bit line structure 500 is formed, the structural layer to be etched needs to be formed on the bit line structure 500, then the second stacked structure 700 and the first stacked structure are formed sequentially to define the node contact hole, and then, the structural layer to be etched is etched by taking the second stacked structure 700 and the first stacked structure as masks, thereby forming the node contact hole.

In one of the embodiments, the second stacked structure 700 includes a fourth material layer 710 and a fifth material layer 720 stacked from bottom to top.

The first material layer 210 and the fourth material layer 710 are both organic mask material layers, and the second material layer 220 and the fifth material layer 720 are both hard mask material layers.

In one of the embodiments, the substrate includes an array region and a peripheral circuit region located at the periphery of the array region. The manufacturing method further includes the following operations.

A photoresist layer is formed, and the photoresist layer covers the peripheral region and exposes the array region.

The second stacked structure is patterned by taking the photoresist layer and the first stacked structure as masks.

In this embodiment, after the first stacked structure including the first material layer and the second material layer is formed, it is necessary to continue patterning the array region. In such case, a layer of photoresist needs to be coated on the peripheral circuit region to form a photoresist layer, then the second stacked structure is etched by taking the photoresist and the first stacked structure as masks, and the shape of the first stacked structure is transferred into the second stacked structure. For example, after the second stacked structure is etched by taking the first stacked structure as a mask in the array region, the remaining portion of the second stacked structure forms a columnar structure, and the node contact hole is defined by the columnar structure. After patterning of the array region is completed, the photoresist layer is removed. In this embodiment, since the top of each spacer structure is higher than the top of the second material layer or is flush with the top of the second material layer, the surface of the second material layer is completely coated. In this way, when the photoresist layer is removed by using an organic solvent, the solvent is not in contact with the second material layer to prevent the second material layer from being damaged, thereby ensuring that the first stacked structure has a good shape.

In order to better explain the disclosure, the manufacturing method will be described in detail below by taking a semiconductor structure having a bit line structure 500 and word line structures 400 as an example according to the sequence of manufacturing processes.

Figure 4:
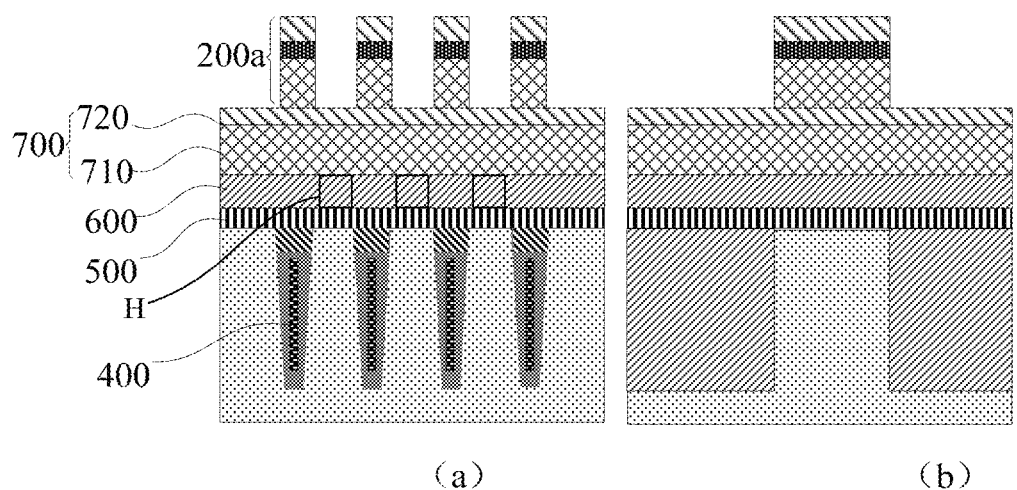
FIG. 4 is a schematic cross-sectional structural diagram of a semiconductor structure having a first stacked structure and a second stacked structure according to an embodiment.

In step 1, referring to FIG. 4, (a) in FIG. 4 is a schematic cross-sectional structural diagram in an array region, and (b) in FIG. 4 is a schematic cross-sectional structural diagram in a peripheral circuit region. In this embodiment, firstly, the second stacked structure 700 is formed on the substrate 100, and the specific operations are as follows. Si-containing materials, such as organosiloxane, are coated on the structural layer to be etched 600 by a coating process to form a second organic mask material layer. a silicon nitride material is deposited on the second organic mask material layer to form a second hard mask material layer; then, a layer of photoresist is coated on the second hard mask material layer to form a second photoresist coating, the second photoresist coating is patterned through a photoetching process, and the patterned second photoresist coating has a pattern defining the second stacked structure 700; and finally, the second organic mask material layer and the second hard mask material layer are etched by taking the patterned second photoresist coating as a mask to form the second stacked structure 700 having the second organic mask material layer and the second hard mask material layer.

Then, the gap between the second stacked structures 700 is filled with a silicon oxide material to form a silicon oxide filling layer; Si-containing materials, such as organosiloxane, are coated on the surfaces of the silicon oxide filling layer and the second stacked structure 700 through the coating process to form a first organic mask material layer; a silicon oxide material is deposited on the first organic mask material layer to form a first hard mask material layer; a silicon nitride material is deposited on the first hard mask material layer to form a third material layer 230; a layer of photoresist is coated on the third material layer 230 to form a first photoresist coating, the first photoresist coating is patterned through the photoetching process, and the patterned first photoresist coating has a pattern defining the first pattern structure 200a. Finally, the first organic mask material layer, the first hard mask material layer and the third material layer are etched by taking the patterned first photoresist coating as a mask to form the first pattern structure 200a having the first organic mask material layer, the first hard mask material layer and the third material layer 230.

It is to be understood that in order to ensure the integrity and uniformity of a strip mask pattern, the coverage region of the generated strip mask pattern may be greater than the actual array region. In order to avoid pattern transfer in the array peripheral region, the photoresist is used to cover the peripheral region of the array region. However, the photoresist may contaminate and damage the organic mask material layer, so it is necessary to form the spacer structure 300 for protecting the first organic mask material layer. In the processes of depositing the silicon oxide material to form a silicon oxide material layer and etching the silicon oxide material layer through an etching-back technology to form the spacer structure 300, since the first hard mask material layer is thinner, the top of the spacer structure 300 may be lower than the top of the first organic mask material layer, which cannot provide a good protective effect on the first organic mask material layer. Based on this, in this embodiment, the third material layer 230 is additionally arranged to increase the height of the spacer structure 300, so that the spacer structure 300 completely cover the side walls of the first organic mask material layer, so as to provide good protection to the first organic mask material layer.

In step 2, the spacer structures 300 covering the side walls of the first pattern structure 200a are formed.

Figure 5:
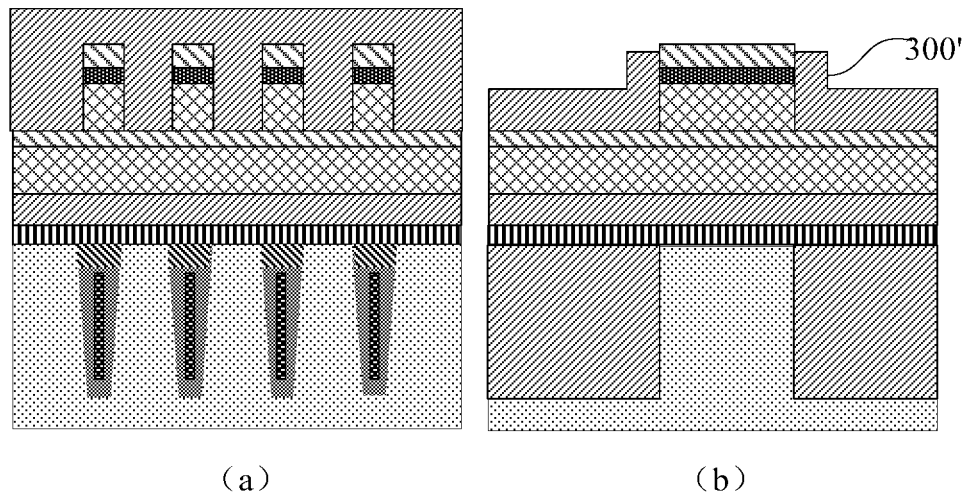
FIG. 5 is a schematic cross-sectional structural diagram of a semiconductor structure having an isolation material layer according to an embodiment.
Figure 6:
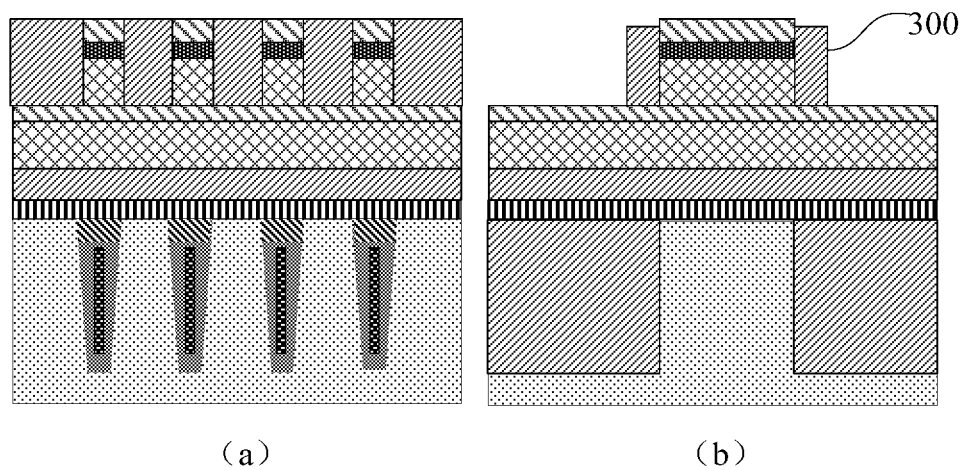
FIG. 6 is a schematic cross-sectional structural diagram of a semiconductor structure having spacer structures according to an embodiment.

The isolation material layer 300' is formed by depositing the insulating material through the deposition process, and the isolation material layer 300' covers the side walls and upper surface of the stacked structure 200. Furthermore, in the array region, the isolation material layer 300' fills the gap between the first pattern structures 200a. Referring to FIG. 5, (a) in FIG. 5 is a schematic cross-sectional structural diagram in an array region, and (b) in FIG. 5 is a schematic cross-sectional structural diagram in a peripheral circuit region. Then, the isolation material layer 300' is etched through an etching process to remove the isolation material layer 300' on the upper surface of the stacked structure 200 and retain the insulating material on the side walls of the isolation material layer 300', so as to form the spacer structures 300. Since the isolation material layer 300' has a large thickness, it may be ensured that the top of each of the formed spacer structures 300 is higher than the top of the first organic mask material layer. Referring to FIG. 6, (a) in FIG. 6 is a schematic cross-sectional structural diagram in an array region, and (b) in FIG. 6 is a schematic cross-sectional structural diagram in a peripheral circuit region.

Figure 7:
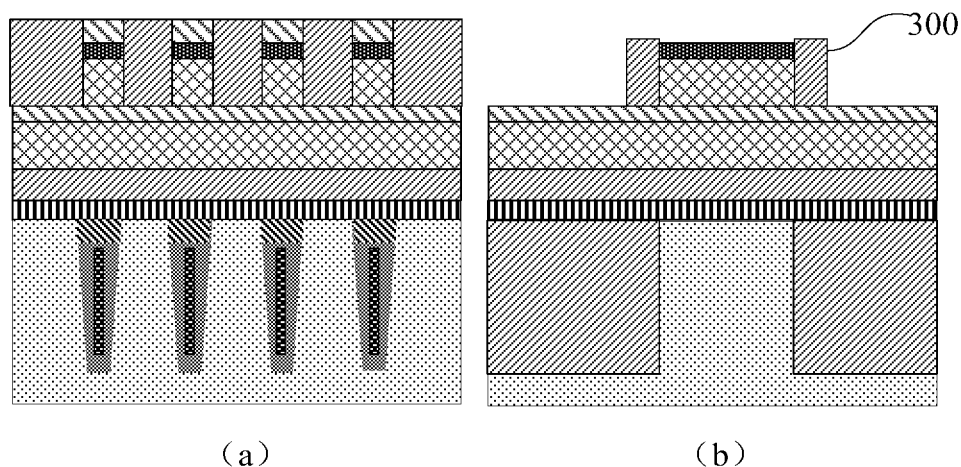
FIG. 7 is a schematic cross-sectional structural diagram of a semiconductor structure after a third material layer is removed according to an embodiment.

In step 3, the third material layer 230 is removed through the wet etching with phosphoric acid. Referring to FIG. 7, (a) in FIG. 7 is a schematic cross-sectional structural diagram in an array region, and (b) in FIG. 7 is a schematic cross-sectional structural diagram in a peripheral circuit region. It is to be understood that in this embodiment, the third material layer 230 is made of a silicon nitride material, the spacer structure 300 and the first hard mask material layer are made of a silicon oxide material, and phosphoric acid has a higher etching selectivity to silicon nitride, so that in the process of removing the third material layer, the etching on the spacer structure and the first hard mask material layer may be reduced to avoid exposure of the first material layer 210 and excessive etching of the first hard mask material layer.

The embodiments of the disclosure further provide a semiconductor structure formed by the method for manufacturing the semiconductor structure described in any one of the above embodiments. The semiconductor structure includes a substrate 100, a first material layer 210, a second material layer 220 and a spacer structure 300.

The first material layer 210 is located on the substrate 100. The second material layer 220 is located on the first material layer 210 and arranged in a stacked manner with the first material layer 210. The spacer structure 300 is arranged on the side wall of the first material layer 210 and the second material layer 220, and the top of the spacer structure 300 is not lower than the top of the first material layer 210.

In this embodiment, since the top of each spacer structure is higher than the top of the second material layer or is flush with the top of the second material layer, the surface of the second material layer is completely coated, and the spacer structures 300 completely cover the second material layer to prevent the second material layer from being damaged. For example, when the first material layer 210 and the second material layer 220 are used as hard masks to pattern the array region, a photoresist layer needs to be formed in the peripheral circuit region, and in the patterning process, the photoresist layer is used as a mask to prevent the peripheral circuit region from being etched. After the patterning of the array region is completed, the photoresist layer needs to be removed by using an organic solvent. In such case, since the surface of the second material layer is completely coated, the organic solvent is not in contact with the second material layer to prevent the second material layer from being damaged, so as to ensure that the first stacked structure has a good shape.

The disclosure provides a semiconductor structure and a manufacturing method thereof. The manufacturing method includes the following operations. A substrate 100 is provided. A stacked structure 200 is formed on the substrate 100, and the stacked structure 200 at least includes a first material layer 210, a second material layer 220 and a third material layer 230 from bottom to top. The stacked structure 200 is patterned to form a first pattern structure 200a. A spacer structure 300 is formed on a side wall of the first pattern structure 200a. The third material layer 230 is removed, and in the process of removing the third material layer 230, the etching selectivity of the third material layer 230 to the second material layer 220 is greater than 1. In the disclosure, the stacked structure 200 having the first material layer 210, the second material layer 220 and the third material layer 230 is formed firstly, and then, the spacer structures 300 are formed on the side walls of the first pattern structure 200a, so that the height of each spacer structure 300 may be effectively increased to ensure that the height of each spacer structure is greater than the height of the first material layer 210 as much as possible, so as to enhance the protection to the first material layer 210 and prevent the first material layer 210 from being damaged in the subsequent processes, thereby improving the device quality.

It should be understood that although the steps of the flowchart in FIG. 1 are shown sequentially as indicated by the arrows, the steps are not necessarily performed sequentially as indicated by the arrows. Unless specifically stated otherwise herein, the steps are not performed in a strict order, and the steps may be performed in other orders. Moreover, at least part of the steps in FIG. 1 may include multiple steps or phases that are not necessarily performed at the same time, but may be performed at different times, and the steps or phases are not necessarily performed in sequence, but rather may be performed in turns or alternation with other steps or at least part of the steps or phases in the other steps.

In the descriptions of this specification, the description with reference to the terms "some embodiments", "other embodiments", "ideal embodiments", etc. means that specific features, structures, materials, or features described in combination with the embodiment or example are included in at least one embodiment or example of the disclosure. In this specification, the exemplary description of the above terms does not necessarily refer to the same embodiment or example.

Various technical features in the above embodiments may be randomly combined. For brief description, not all possible combinations of various technical features in the embodiments are described. However, the combinations of these technical features without contradiction should be regarded as falling within the scope of the specification.

The embodiments represent only several implementations of the disclosure, and the descriptions are relatively specific and detailed, but should not be construed as limiting the scope of the disclosure. It should be noted that several variations and improvements can be made by those of ordinary skill in the art without departing from the conception of the disclosure, and these all fall within the scope of protection of the disclosure. Therefore, the scope of protection of the disclosure should be subject to the appended claims.

The invention claimed is:

1. A method for manufacturing a semiconductor structure, comprising:
    providing a substrate, the substrate comprising an array region and a peripheral circuit region located at a periphery of the array region;
    forming a stacked structure on the substrate, the stacked structure at least comprising a first material layer, a second material layer and a third material layer from bottom to top;
    patterning the stacked structure to obtain a first pattern structure;
    forming a spacer structure on a side wall of the first pattern structure, a top of the spacer structure being not lower than a top of the first material layer;
    removing the third material layer, wherein during removing the third material layer, an etching selectivity of the third material layer to the second material layer is greater than 1;
    forming a photoresist layer, the photoresist layer covering the peripheral circuit region and exposing the array region;
    patterning the array region; and
    removing the photoresist layer by using an organic solvent, wherein the first material layer is isolated from the organic solvent by the spacer structure and the second material layer.

2. The method for manufacturing the semiconductor structure of claim 1, wherein a thickness of the second material layer is less than that of the third material layer.

3. The method for manufacturing the semiconductor structure of claim 1, wherein an etching selectivity of the third material layer to the second material layer and the spacer structure is greater than 5.

4. The method for manufacturing the semiconductor structure of claim 1, wherein forming the spacer structure comprises:
    at least forming an isolation material layer on the side wall and an upper surface of the first pattern structure; and
    etching the isolation material layer to remove the isolation material layer on the upper surface of the first pattern structure and retain the isolation material layer on the side wall of the first pattern structure, to form the spacer structure.

5. The method for manufacturing the semiconductor structure of claim 4, wherein the second material layer and the spacer structure are made of a silicon oxide material, and the third material layer is made of a silicon nitride material.

6. The method for manufacturing the semiconductor structure of claim 1, wherein a thickness of the second material layer is 3 nm to 30 nm, and a thickness of the third material layer is 5 nm to 100 nm.

7. The method for manufacturing the semiconductor structure of claim 1, wherein when the first pattern structure is a patterned first stacked structure, the method further comprises:
    before the patterned first stacked structure is formed, forming a second stacked structure on the substrate;
    wherein the second stacked structure is located between the patterned first stacked structure and the substrate.

8. The method for manufacturing the semiconductor structure of claim 7, wherein before forming the second stacked structure on the substrate, the method further comprises:
    patterning the substrate to form an active area;
    forming word line structures in the substrate;

forming a bit line structure on the substrate; and forming a structural layer to be etched on the substrate.

9. The method for manufacturing the semiconductor structure of claim 7, further comprising:

patterning the second stacked structure by taking the photoresist layer and the first pattern structure as masks.

10. The method for manufacturing the semiconductor structure of claim 7, wherein the second stacked structure comprises a fourth material layer and a fifth material layer stacked from bottom to top, wherein the first material layer and the fourth material layer are organic mask material layers, and the second material layer and the fifth material layer are hard mask material layers.

11. The method for manufacturing the semiconductor structure of claim 7, wherein the patterned first stacked structure is a strip structure extending along a first direction, the second stacked structure is a second strip structure extending along a second direction, and a projection of the second stacked structure on the substrate is overlapped with a projection of the patterned first stacked structure on the substrate.

12. The method for manufacturing the semiconductor structure of claim 11, wherein a node contact hole is defined by the patterned first stacked structure and the second stacked structure.

13. The method for manufacturing the semiconductor structure of claim 8, wherein the structural layer to be etched is etched by taking the second stacked structure and the patterned first stacked structure as masks to form a node contact hole.

14. A semiconductor structure formed by the method for manufacturing the semiconductor structure of claim 1, comprising:

the substrate;

the first material layer located on the substrate;

the second material layer located on the first material layer and arranged in a stacked manner with the first material layer; and the spacer structure arranged on a side wall of the first material layer and the second material layer, the top of the spacer structure being not lower than the top of the first material layer.

* * * * *